United States Patent
Lee et al.

(10) Patent No.: US 11,876,103 B2
(45) Date of Patent: Jan. 16, 2024

(54) DISPLAY PANEL

(71) Applicant: AUO Corporation, Hsinchu (TW)

(72) Inventors: Min-Tse Lee, Hsinchu (TW);
Sheng-Yen Cheng, Hsinchu (TW);
Yueh-Hung Chung, Hsinchu (TW);
Ya-Ling Hsu, Hsinchu (TW);
Chen-Hsien Liao, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/173,811

(22) Filed: Feb. 24, 2023

(65) Prior Publication Data

US 2023/0197737 A1 Jun. 22, 2023

Related U.S. Application Data

(63) Continuation of application No. 17/023,389, filed on Sep. 17, 2020, now Pat. No. 11,626,425.

(60) Provisional application No. 62/901,837, filed on Sep. 18, 2019.

(30) Foreign Application Priority Data

Sep. 3, 2020 (TW) .................................. 109130291

(51) Int. Cl.
*H01L 27/12* (2006.01)
*G02F 1/1362* (2006.01)
*G02F 1/1368* (2006.01)

(52) U.S. Cl.
CPC ...... *H01L 27/124* (2013.01); *G02F 1/136286* (2013.01); *G02F 1/1368* (2013.01)

(58) Field of Classification Search
CPC .......................... H01L 27/124; G02F 1/136286
See application file for complete search history.

(56) References Cited

U.S. PATENT DOCUMENTS

| | | | |
|---|---|---|---|
| 2007/0115239 A1* | 5/2007 | Yonemochi | G09G 3/3688 345/98 |
| 2015/0277173 A1* | 10/2015 | Jung | G02F 1/13336 349/69 |
| 2020/0278584 A1* | 9/2020 | Kajita | G02F 1/136286 |

* cited by examiner

*Primary Examiner* — Peter M Albrecht
(74) *Attorney, Agent, or Firm* — JCIPRNET (57) ABSTRACT

A display panel includes a plurality of sub-pixel structures and a plurality of transfer elements. The sub-pixel structures include a plurality of first sub-pixel structures. A data line of each of the first sub-pixel structures is disposed adjacent to a corresponding transfer element, and a scan line of each of the first sub-pixel structures is electrically connected to the corresponding transfer element. The first sub-pixel structures include a plurality of first-type sub-pixel structures and a plurality of second-type sub-pixel structures. When the display panel displays a grayscale picture, each of the first-type sub-pixel structures has first brightness, each of the second-type sub-pixel structures has second brightness. The first brightness is less than the second brightness. A total number of the first sub-pixel structures of the display panel is A, a number of the first-type sub-pixel structures in the first sub-pixel structures is a, and 50%<(a/A)<100%.

6 Claims, 7 Drawing Sheets

DISPLAY PANEL

CROSS-REFERENCE TO RELATED APPLICATION

This application is a continuation application of and claims the priority benefit of U.S. application Ser. No. 17/023,389, filed on Sep. 17, 2020, which claims the priority benefits of U.S. provisional application Ser. No. 62/901,837, filed on Sep. 18, 2019, and Taiwan application Ser. No. 109130291, filed on Sep. 3, 2020. The entirety of each of the above-mentioned patent applications is hereby incorporated by reference herein and made a part of this specification.

BACKGROUND

1. Technical Field

The disclosure relates to a display panel.

2. Description of Related Art

With the development of display technology, optical characteristics such as high resolution, high contrast, wide viewing angles, etc. no longer satisfy people's requirements for display panels. Display panels are now further required to provide an elegant appearance. For example, borders of display panels are required to be narrow borders or even to be borderless.

In general, a display panel includes a pixel array disposed in an active area, a data driving circuit disposed on an upper side or a lower side of the active area, and a gate driving circuit disposed on a left side, a right side, or left and right sides of the active area. In order to reduce widths of the left and right sides of the border of the display panel, both the gate driving circuit and the data driving circuit may be disposed on the same side (that is, the upper side or the lower side) of the active area. When the gate driving circuit is disposed on the same side of the active area, a scan line extending in a horizontal direction may be electrically connected to the gate driving circuit through a transfer element extending in a vertical direction. However, since the transfer element is interspersed in the pixel array, a gate driving signal of the transfer element may easily affect data signals of adjacent data lines, and display quality of the display panel is thereby affected.

SUMMARY

The disclosure provides a display panel providing good display quality.

A display panel provided by the disclosure includes a plurality of sub-pixel structures and a plurality of transfer elements. Each of the sub-pixel structures includes a data line, a scan line, an active element, and a pixel electrode, the data line and the scan line are electrically connected to the active element, and the active element is electrically connected to the pixel electrode. The plurality of transfer elements are disposed between the plurality of sub-pixel structures, intersected with the scan lines of the plurality of sub-pixel structures, and electrically connected to the plurality of scan lines of the plurality of sub-pixel structures. The plurality of sub-pixel structures include a plurality of first sub-pixel structures, the data line of each of the first sub-pixel structures is disposed adjacent to a corresponding transfer element, and the scan line of the each of the first sub-pixel structures is electrically connected to the transfer element. The plurality of first sub-pixel structures include a plurality of first-type sub-pixel structures and a plurality of second-type sub-pixel structures. When the display panel displays a grayscale picture, each of the first-type sub-pixel structures has first brightness, each of the second-type sub-pixel structures has second brightness, and the first brightness is less than the second brightness. A total number of the plurality of first sub-pixel structures of the display panel is A, a number of the plurality of first-type sub-pixel structures in the plurality of first sub-pixel structures is a, and $50\% < (a/A) < 100\%$.

In an embodiment of the disclosure, the plurality of transfer elements include a first transfer element and are arranged in a first direction. The first transfer element extends in a second direction perpendicular to the first direction and is electrically connected to two of the first sub-pixel structures. The two first sub-pixel structures are arranged in a third direction, and the third direction is staggered with the first direction and the second direction. The two first sub-pixel structures are two of the first-type sub-pixel structures.

In an embodiment of the disclosure, the plurality of transfer elements include a second transfer element and are arranged in a first direction. The second transfer element extends in a second direction perpendicular to the first direction and is electrically connected to two of the first sub-pixel structures. The two first sub-pixel structures are arranged in a third direction, and the third direction is staggered with the first direction and the second direction. One of the two first sub-pixel structures is one of the plurality of first-type sub-pixel structures, and the other one of the two first sub-pixel structures is one of the plurality of second-type sub-pixel structures.

In an embodiment of the disclosure, the plurality of transfer elements include a third transfer element and are arranged in a first direction. The third transfer element extends in a second direction perpendicular to the first direction and is electrically connected to two of the plurality of first sub-pixel structures. The two first sub-pixel structures are arranged in a first direction, and the two first sub-pixel structures are two of the plurality of first-type sub-pixel structures.

In an embodiment of the disclosure, the plurality of transfer elements include a fourth transfer element and are arranged in a first direction. The fourth transfer element extends in a second direction perpendicular to the first direction and is electrically connected to two of the plurality of first sub-pixel structures. The two first sub-pixel structures are arranged in the first direction. One of the two first sub-pixel structures is one of the plurality of first-type sub-pixel structures, and the other one of the two first sub-pixel structures is one of the plurality of second-type sub-pixel structures.

In an embodiment of the disclosure, the grayscale picture is a $32^{nd}$ grayscale picture, a $64^{th}$ grayscale picture, a $96^{th}$ grayscale picture, a $128^{th}$ grayscale picture, a $160^{th}$ grayscale picture, a $192^{nd}$ grayscale picture, or a $224^{th}$ grayscale picture.

In an embodiment of the disclosure, the plurality of transfer elements are arranged in a first direction, and each of the transfer elements extends in a second direction perpendicular to the first direction. The plurality of sub-pixel structures include a plurality of first sub-pixel columns and a plurality of second sub-pixel columns. A plurality of sub-pixel structures of each of the first sub-pixel columns are arranged in the second direction and are configured to display blue, and a plurality of sub-pixel structures of each of the second sub-pixel columns are arranged in the second direction and are configured to display red. Each of the transfer elements is disposed between a corresponding one of the first sub-pixel columns and a corresponding one of the second sub-pixel columns.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Exemplary embodiments of the disclosure are described in detail, and examples of the exemplary embodiments are shown in the accompanying drawings. Whenever possible, the same element symbols are used in the drawings and descriptions to indicate the same or similar parts.

It should be understood that when an element such as a layer, film, region or substrate is referred to as being "on" or "connected to" another element, it may be directly on or connected to the another element, or intervening elements may also be present. In contrast, when an element is referred to as being "directly on" or "directly connected to" another element, there are no intervening elements present. As used herein, "connection" may refer to a physical and/or electrical connection. Furthermore, "electrical connection" or "coupling" may mean that there is another element between two elements.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the disclosure belongs. It will be further understood that terms such as those defined in commonly used dictionaries should be interpreted as having a meaning that is consistent with their meaning in the context of the relevant art and the disclosure and will not be interpreted in an idealized or overly formal sense unless expressly so defined herein.

Figure 1:
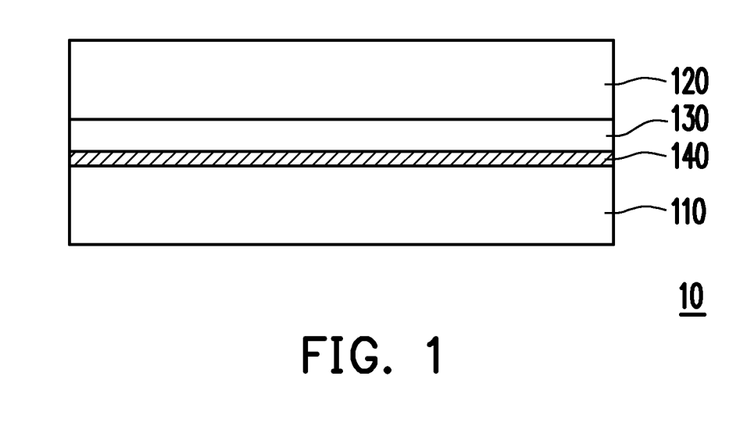
FIG. 1 is a schematic cross-sectional view of a display panel 10 according to an embodiment of the disclosure.

FIG. 1 is a schematic cross-sectional view of a display panel 10 according to an embodiment of the disclosure.

Figure 2:
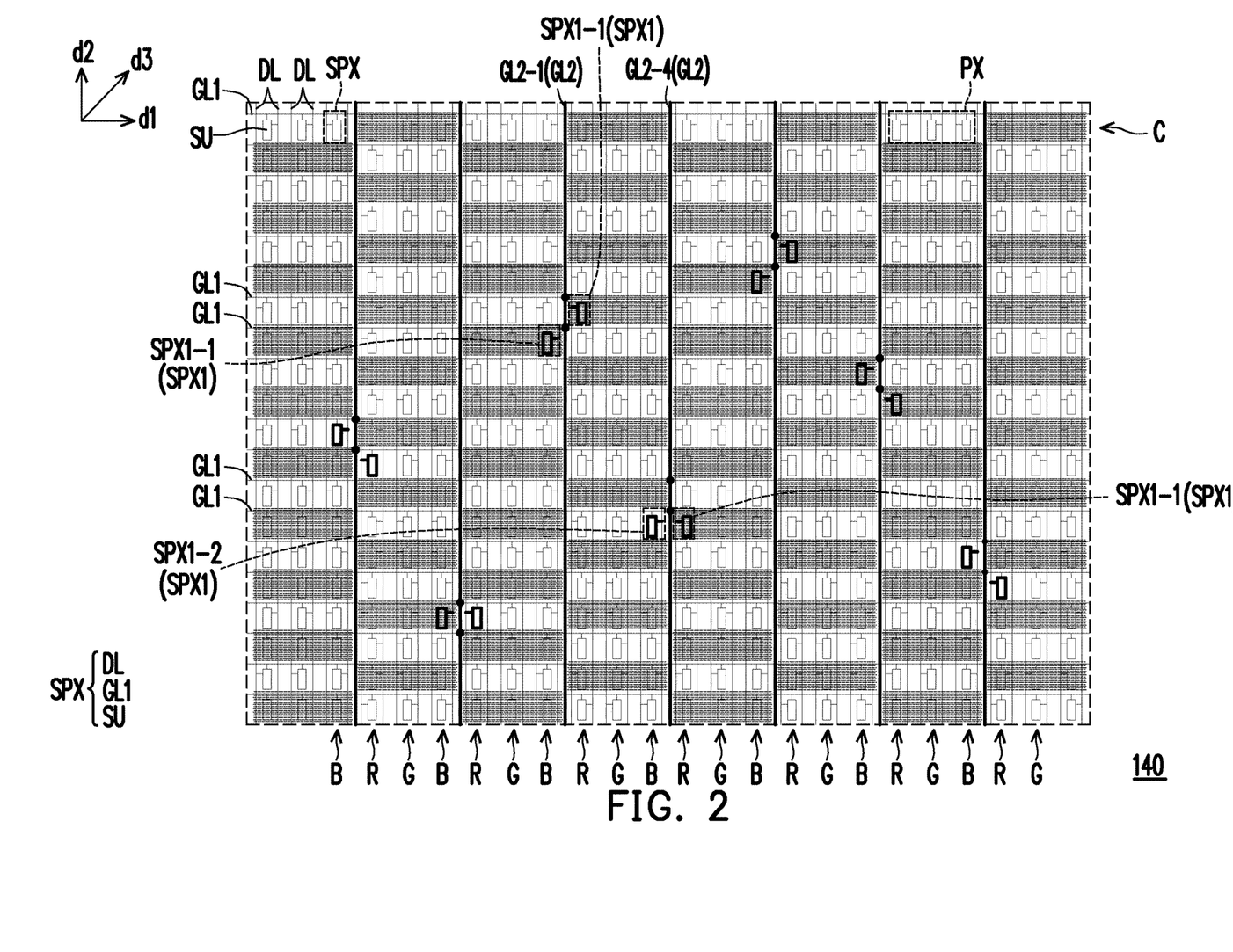
FIG. 2 is a schematic top view of a pixel array 140 of the display panel 10 according to an embodiment of the disclosure.

FIG. 2 is a schematic top view of a pixel array 140 of the display panel 10 according to an embodiment of the disclosure.

Referring to FIG. 1 and FIG. 2, the display panel 10 includes a first substrate 110, a second substrate 120, a display medium 130, and a pixel array 140. The second substrate 120 is disposed opposite to the first substrate 110, the display medium 130 is disposed between the first substrate 110 and the second substrate 120, and the pixel array 140 is disposed on the first substrate 110 and is located between the display medium 130 and the first substrate 110.

For example, in the present embodiment, a material of the substrate 110 may be glass, quartz, an organic polymer, or other applicable materials. For example, in the present embodiment, a material of the substrate 120 may be glass, quartz, an organic polymer, or other applicable materials.

In the present embodiment, the display medium 130 is, for example, a liquid crystal layer. However, the disclosure is not limited thereto. In other embodiments, the display medium 130 may also be made of other applicable materials, for example, but not limited to: an organic electroluminescent layer or a plurality of miniature light-emitting diodes (μ LEDs).

Figure 3:
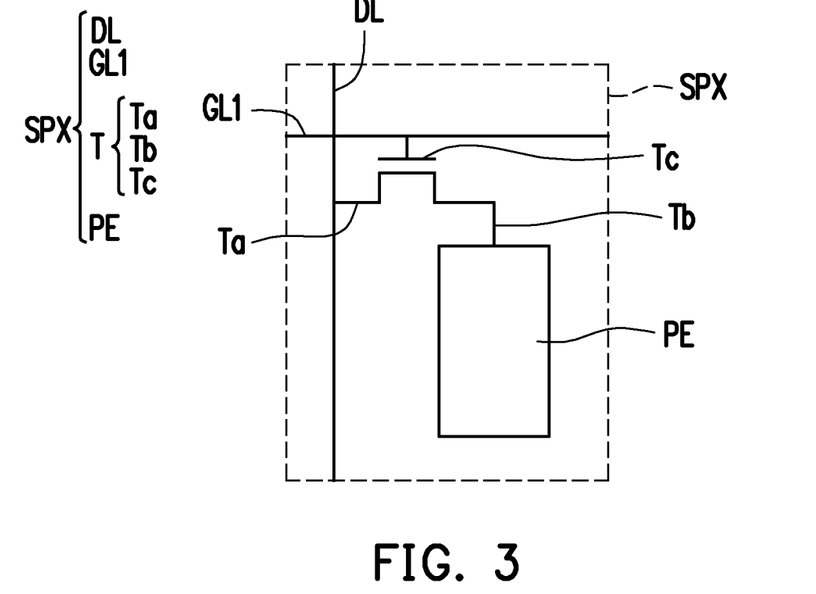
FIG. 3 is a schematic diagram of an equivalent circuit of a sub-pixel structure SPX according to an embodiment of the disclosure.

FIG. 3 is a schematic diagram of an equivalent circuit of a sub-pixel structure SPX according to an embodiment of the disclosure.

Referring to FIG. 2 and FIG. 3, the pixel array 140 includes a plurality of sub-pixel structures SPX. Each of the sub-pixel structures SPX includes a data line DL, a scan line GL1, and a sub-pixel unit SU. The sub-pixel unit SU includes an active element T and a pixel electrode PE, the data line DL and the scan line GL1 are electrically connected to the active element T, and the active element T is electrically connected to the pixel electrode PE.

For example, in the present embodiment, the active element T may include a thin film transistor. The thin film transistor has a first terminal Ta, a second terminal Tb, and a control terminal Tc. The first terminal Ta of the thin film transistor is electrically connected to the data line DL, the control terminal Tc of the thin film transistor is electrically connected to the scan line GL1, and the second terminal Tb of the thin film transistor is electrically connected to the pixel electrode PE.

Referring to FIG. 2, the pixel array 140 further includes a plurality of transfer elements GL2. The plurality of transfer elements GL2 are disposed between the plurality of sub-pixel structures SPX. In other words, the plurality of transfer elements GL2 are interspersed in an active area of the display panel 10 (marked in FIG. 1).

The plurality of transfer elements GL2 and the plurality of scan lines GL1 of the plurality of sub-pixel structures SPX are intersected. The plurality of transfer elements GL2 are arranged in a first direction d1, and the plurality of sub-pixel structures SPX include a plurality of sub-pixel columns (for example, a plurality of first sub-pixel columns B, a plurality of second sub-pixel columns R, and a plurality of third sub-pixel column G). The plurality of scan lines GL1 of the plurality of sub-pixel structures SPX of each of the sub-pixel columns are arranged in the second direction d2, and each of the transfer elements GL2 extends in the second direction d2, where the first direction d1 is staggered with the second direction d2. For example, in the present embodiment, the first direction d1 may be substantially perpendicular to the second direction d2, but the disclosure is not limited thereto.

For example, in the present embodiment, a plurality of sub-pixel structures SPX include a plurality of first sub-pixel columns B, a plurality of second sub-pixel columns R, and a plurality of third sub-pixel columns G. A plurality of sub-pixel structures SPX of each of the first sub-pixel columns B are arranged in the second direction d2 and configured to display blue, a plurality of sub-pixel structures SPX of each of the second sub-pixel columns R are arranged in the second direction d2 and configured to display red, and a plurality of sub-pixel structures SPX of each of the third sub-pixel columns G are arranged in the second direction d2 and configured to display green. In the present embodiment, each of the transfer elements GL2 may be selectively disposed between a corresponding one of the first sub-pixel columns B (that is, a blue sub-pixel column) and a corresponding one of the second sub-pixel columns R (that is, a red sub-pixel column), but the disclosure is not limited thereto.

The plurality of transfer elements GL2 are electrically connected to the plurality of scan lines GL1 of the plurality of sub-pixel structures SPX. In the present embodiment, the same transfer element GL2 may be selectively electrically connected to two adjacent scan lines GL1, but the disclosure is not limited thereto.

For example, in the present embodiment, a scan line GL1 may belong to a first metal layer, a data line DL1 may belong to a second metal layer, and a transfer element GL2 may include a wire segment (not marked) belonging to the first metal layer, a second wire segment (not marked) belonging to the second metal layer, or a combination thereof.

Referring to FIG. 2, the plurality of sub-pixel structures SPX include a plurality of first sub-pixel structures SPX1, the data line DL of each of the first sub-pixel structures SPX1 is disposed adjacent to a corresponding transfer element GL2, and the scan line GL1 of each of the first sub-pixel structures SPX1 is electrically connected to the corresponding transfer element GL2. No data lines DL of other sub-pixel structures SPX are disposed between the data line DL of each of the first sub-pixel structures SPX1 and a corresponding one of the transfer elements GL2. In other words, each of the first sub-pixel structures SPX1 refers to a sub-pixel structure SPX in which a data signal of the data line DL1 is susceptible to a gate driving signal of the transfer element GL2.

Referring to FIG. 2, the display panel 10 (marked in FIG. 1) has a spatial domain function. When the display panel 10 turns on the spatial domain function and displays a grayscale image, the display panel 10 is divided into a plurality of main areas (the area not occupied by the dot pattern in FIG. 2) and a plurality of secondary areas (the area occupied by the dot pattern in FIG. 2), where brightness of each of the secondary areas is less than brightness of each of the main areas.

The plurality of first sub-pixel structures SPX1 that are susceptible to the gate driving signal of the transfer element GL2 include a plurality of first-type sub-pixel structures SPX1-1 and a plurality of second-type sub-pixel structures SPX1-2. The plurality of first-type sub-pixel structures SPX1-1 are located in the plurality of secondary areas, and the plurality of second-type sub-pixel structures SPX1-2 are located in the plurality of main areas. In other words, when the display panel 10 turns on the spatial domain function and displays a grayscale picture, each of the first-type sub-pixel structures SPX1-1 has first brightness, each of the second-type sub-pixel structures SPX1-2 has second brightness, and the first brightness is less than the second brightness.

Figure 4:
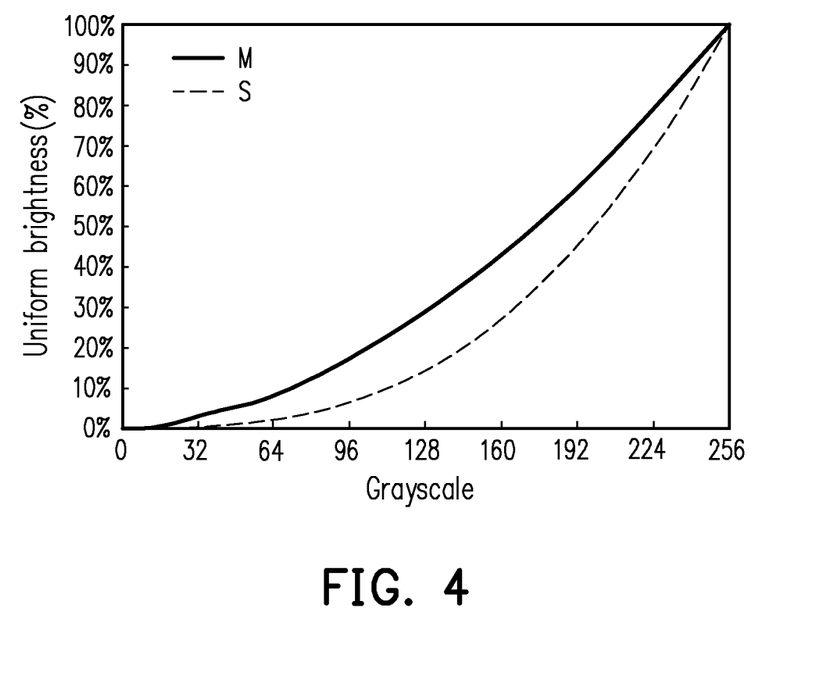
FIG. 4 shows a gamma curve M of a main area and a gamma curve S of a secondary area when the display panel 10 turns on a spatial domain function according to an embodiment of the disclosure.

FIG. 4 shows a gamma curve M of a main area and a gamma curve S of a secondary area when the display panel 10 turns on a spatial domain function according to an embodiment of the disclosure.

Referring to FIG. 1, FIG. 2, and FIG. 4, for example, in the present embodiment, when the display panel 10 turns on the spatial domain function and displays the $32^{nd}$ grayscale picture, the $64^{th}$ grayscale picture, the $96^{th}$ grayscale picture, the $128^{th}$ grayscale picture, the $160^{th}$ grayscale picture, the $192^{nd}$ grayscale picture, or the $224^{th}$ grayscale picture, the first brightness of each of the first-type sub-pixel structures SPX1-1 is less than the second brightness of each of the second-type sub-pixel structure SPX1-2. However, the foregoing grayscale pictures displayed by the display panel 10 may refer to the $32^{nd}$ grayscale picture, the $64^{th}$ grayscale picture, the $96^{th}$ grayscale picture, the $128^{th}$ grayscale picture, the $160^{th}$ grayscale picture, the $192^{nd}$ grayscale picture, or the $224^{th}$ grayscale picture.

It should be noted that, a total number of the plurality of first sub-pixel structures SPX1 of the display panel 10 (marked in FIG. 1) that are susceptible to the gate driving signal of the transfer element GL2 is A, a number of the plurality of first-type sub-pixel structures SPX1-1 in the plurality of first sub-pixel structures SPX1 is a, and 50%<(a/A)<100%. In other words, the plurality of first sub-pixel structures SPX1 that are susceptible to the gate driving signal of the transfer element GL2 are disposed in the plurality of secondary areas with low brightness (the area occupied by the dot pattern in FIG. 2) as far as possible. Therefore, the plurality of first sub-pixel structures SPX1 that are susceptible to the gate driving signal of the transfer element GL2 and cause generation of abnormal brightness are less visible to human eyes, so that the display panel 10 provides favorable display quality.

For example, in the present embodiment, the display panel 10 is a 65-inch display panel. A ratio (a/A) of the number of the first-type sub-pixel structures SPX1-1 of the display panel 10 to the total number of all of the first sub-pixel structures SPX1 of the display panel 10 of the total quantity is approximately equal to 78%, but the disclosure is not limited thereto.

It should be noted that FIG. 2 schematically shows a small area of the display panel 10, and a ratio (for example, 8/14 is approximately equal to 57%) of the number of the plurality of first-type sub-pixel structures SPX1-1 in the small area to the number of the plurality of first sub-pixel structures SPX1 is used to schematically represent the ratio (a/A) of the number of the plurality of first-type sub-pixel structures SPX1-1 of the display panel 10 to the total number of all of the first sub-pixel structures SPX1 of the display panel 10. The ratio of the number of the plurality of first-type sub-pixel structures SPX1-1 to the number of the plurality of first sub-pixel structures SPX1 in the small area may not be exactly equal to the ratio (a/A) of the number of the plurality of first-type sub-pixel structures SPX1-1 of the display panel 10 to the total number of all of the first sub-pixel structures SPX1 of the display panel 10.

In the present embodiment, the plurality of transfer elements GL2 include a first transfer element GL2-1 and are arranged in a first direction, the first transfer element GL2-1 extends in a second direction d2 perpendicular to the first direction d1 and is electrically connected to two of the plurality of first sub-pixel structures SPX1, the two first sub-pixel structures SPX1 are arranged in a third direction d3, the third direction d3 is staggered with the first direction d1 and the second direction d2, and the two first sub-pixel structures SPX1 are two of the plurality of first-type sub-pixel structures SPX1-1.

In brief, in the present embodiment, the plurality of first sub-pixel structures SPX1 that are susceptible to the gate driving signal of the transfer element GL2 and electrically connected to the transfer element GL2 are disposed in a diagonal direction (that is, a third direction d3) and are all disposed in at least one secondary area (the area occupied by the dot pattern in FIG. 2) with low brightness.

In the present embodiment, the plurality of transfer elements GL2 include a fourth transfer element GL2-4 and are arranged in a first direction d1, the fourth transfer element GL2-4 extends in a second direction d2 perpendicular to the first direction d1 and is electrically connected to two of the plurality of first sub-pixel structures SPX1, the two first sub-pixel structures SPX1 are arranged in the first direction d1, one of the two first sub-pixel structures SPX1 is one of the plurality of first-type sub-pixel structures SPX1-1, and the other one of the two first sub-pixel structures SPX1 is one of the plurality of second-type sub-pixel structures SPX1-2.

In brief, in the present embodiment, the plurality of first sub-pixel structures SPX1 that are susceptible to the gate driving signal of another transfer element GL2 and electrically connected to the another transfer element GL2 are disposed in a horizontal direction (that is, a first direction d1). One first sub-pixel structure SPX1 is disposed in a main area (the area not occupied by the dot pattern in FIG. 2) with high brightness, and the other first sub-pixel structure SPX1 is disposed in a secondary area (the area occupied by the dot pattern in FIG. 2) with low brightness.

It should be noted herein that in the following embodiments, reference numerals and some content of the foregoing embodiments are used, and same reference numerals are used to represent same or similar elements, and descriptions about same technical content are omitted. For the omitted descriptions, refer to the foregoing embodiments. Details are not repeated in the following embodiments.

Figure 5:
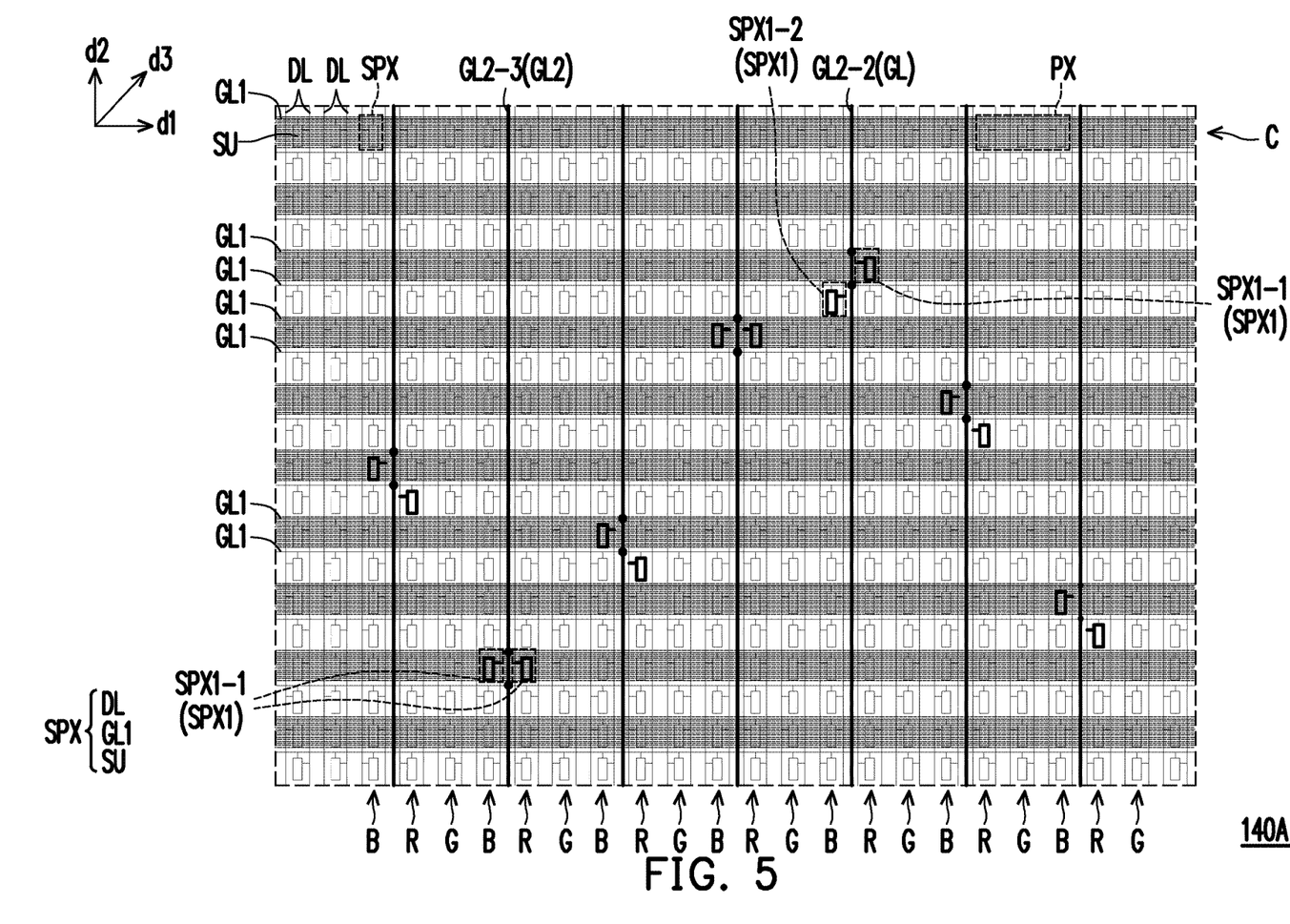
FIG. 5 is a schematic top view of a pixel array 140A according to an embodiment of the disclosure.

FIG. 5 is a schematic top view of a pixel array 140A according to an embodiment of the disclosure. The pixel array 140A of FIG. 5 may replace the pixel array 140 of the display panel 10 of FIG. 1, to form the display panel (not shown) of the present embodiment.

Referring to FIG. 2 and FIG. 5, the display panel in the present embodiment is similar to the foregoing display panel 10. A main difference between the two is that: when the spatial domain function is turned on and a grayscale image is displayed, distribution manners of main areas (the area not occupied by the dot pattern in FIG. 2 and FIG. 5) and a plurality of secondary areas (the areas occupied by the dotted pattern in FIG. 2 and FIG. 5) of the two are different.

Referring to FIG. 2 and FIG. 5, the plurality of sub-pixel structures SPX may form a plurality of pixel structures PX. Each of the pixel structures PX may include three sub-pixel structures SPX, which are located in the same sub-pixel row C and respectively located in a second pixel column R, a third pixel column B, and a first pixel column G that are adjacent to each other.

In the embodiment of FIG. 2, each main area (the area not occupied by the dot pattern in FIG. 2) is an area in which a pixel structure PX is located, each of the secondary areas (the area not occupied by the dot pattern in FIG. 2) is also an area in which a pixel structure PX is located, and a plurality of main areas (the areas not occupied by the dot pattern in FIG. 2) and a plurality of secondary areas (the areas occupied by the dot pattern in FIG. 2) are alternately arranged in the first direction d1 and the second direction d2. In short, in the embodiment of FIG. 2, each of the main areas/secondary areas is an area in which a pixel structure PX is located, and the plurality of main areas and the plurality of secondary areas are in a checkerboard shape.

In the embodiment of FIG. 5, each main area (the area not occupied by the dot pattern in FIG. 5) is an area in which a pixel structure PX is located, each of the secondary areas (the area not occupied by the dot pattern in FIG. 5) is also an area in which a pixel structure PX is located, and a plurality of main areas (the areas not occupied by the dot pattern in FIG. 2) and a plurality of secondary areas (the areas occupied by the dot pattern in FIG. 2) are alternately arranged in the second direction d2 and not alternately arranged in the first direction d1. In short, in the embodiment of FIG. 5, each of the main areas/secondary areas is an area in which a pixel structure PX is located, and the plurality of main areas and the plurality of secondary areas are in a stripe shape.

In addition, in the embodiment of FIG. 5, the plurality of transfer elements GL2 include a second transfer element GL2-2 and are arranged in a first direction d1, and the second transfer element GL2-2 extends in a second direction d2 perpendicular to the first direction d1 and is electrically connected to two of the plurality of first sub-pixel structures SPX1. The two first sub-pixel structures SPX1 are arranged in the third direction d3, the third direction d3 is staggered with the first direction d1 and the second direction d2, one of the two first sub-pixel structures SPX1 is one of the plurality of first-type sub-pixel structures SPX1-1, and the other one of the two first sub-pixel structures SPX1 is one of the plurality of second-type sub-pixel structures SPX1-2.

In brief, in the present embodiment, the plurality of first sub-pixel structures SPX1 that are susceptible to the gate driving signal of a transfer element GL2 and electrically connected to the transfer element GL2 are disposed in a diagonal direction (that is, a third direction d3). One first sub-pixel structure SPX1 is disposed in a main area (the area not occupied by the dot pattern in FIG. 5) with high brightness, and the other first sub-pixel structure SPX1 is disposed in a secondary area (the area occupied by the dot pattern in FIG. 5) with low brightness.

In addition, in the embodiment of FIG. 5, the plurality of transfer elements GL2 include a third transfer element GL2-3 and are arranged in a first direction d1, and the third transfer element GL2-3 extends in a second direction d2 perpendicular to the first direction d1 and is electrically connected to two of the plurality of first sub-pixel structures SPX1. The two first sub-pixel structures SPX1 are arranged in a first direction d1 and are two of the plurality of first-type sub-pixel structures SPX1-1.

In brief, in the present embodiment, the two first sub-pixel structures SPX1 that are susceptible to the gate driving signal of the transfer element GL2 and electrically connected to the transfer element GL2 are disposed in a horizontal direction (that is, a first direction d1) and are both disposed in the secondary area (the area occupied by the dot pattern in FIG. 5) with low brightness.

Figure 6:
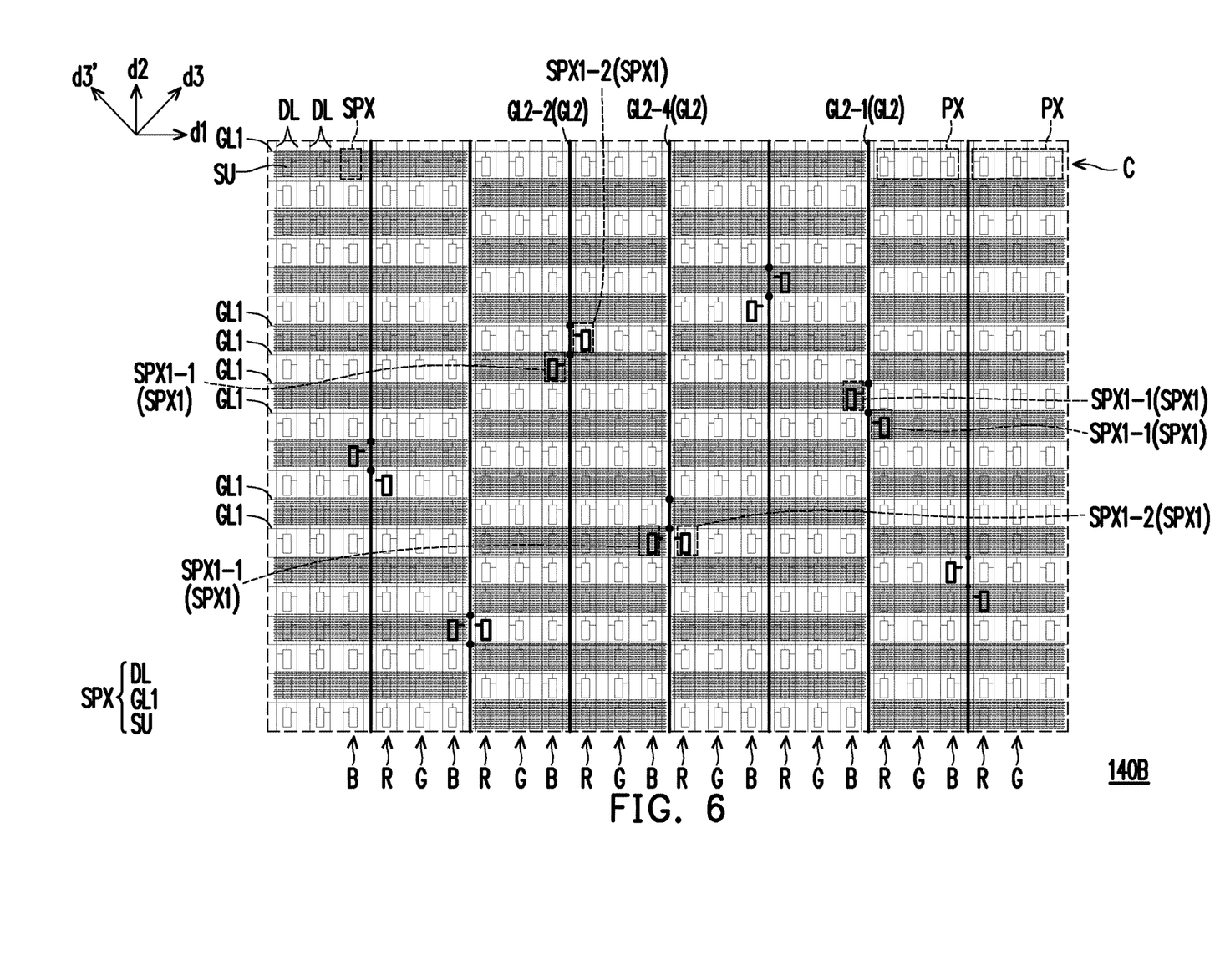
FIG. 6 is a schematic top view of a pixel array 140B according to an embodiment of the disclosure.

FIG. 6 is a schematic top view of a pixel array 140B according to an embodiment of the disclosure. The pixel array 140B of FIG. 6 may replace the pixel array 140 of the display panel 10 of FIG. 1, to form the display panel (not shown) of the present embodiment.

Referring to FIG. 2 and FIG. 6, the display panel in the present embodiment is similar to the foregoing display panel 10. A main difference between the two is that: when the spatial domain function is turned on and a grayscale image is displayed, distribution manners of main areas (the area not occupied by the dot pattern in FIG. 2 and FIG. 6) and a plurality of secondary areas (the areas occupied by the dotted pattern in FIG. 2 and FIG. 6) of the two are different.

Referring to FIG. 2 and FIG. 6, the plurality of sub-pixel structures SPX may form a plurality of pixel structures PX. Each of the pixel structures PX may include three sub-pixel structures SPX, which are located in the same sub-pixel row C and respectively located in a second pixel column R, a third pixel column B, and a first pixel column G that are adjacent to each other.

In the embodiment of FIG. 2, each main area (the area not occupied by the dot pattern in FIG. 2) is an area in which a pixel structure PX is located, each of the secondary areas (the area not occupied by the dot pattern in FIG. 2) is also an area in which a pixel structure PX is located, and a plurality of main areas (the areas not occupied by the dot pattern in FIG. 2) and a plurality of secondary areas (the areas occupied by the dot pattern in FIG. 2) are alternately arranged in the first direction d1 and the second direction d2. In short, in the embodiment of FIG. 2, each of the main areas/secondary areas is an area in which a pixel structure PX is located, and the plurality of main areas and the plurality of secondary areas are in a checkerboard shape.

In the embodiment of FIG. 6, each main area (the area not occupied by the dot pattern in FIG. 6) is an area in which two adjacent pixel structures PX are located, each of the secondary areas (the area not occupied by the dot pattern in FIG. 6) is also an area in which two adjacent pixel structures PX are located, and a plurality of main areas (the areas not occupied by the dot pattern in FIG. 6) and a plurality of secondary areas (the areas occupied by the dot pattern in FIG. 6) are alternately arranged in the first direction d1 and the second direction d2. In short, in the embodiment of FIG. 6, each of the main areas/secondary areas is an area in which two pixel structures PX are located, and the plurality of main areas and the plurality of secondary areas are in a checkerboard shape.

In addition, in the embodiment of FIG. 6, the plurality of transfer elements GL2 include a first transfer element GL2-1 and are arranged in a first direction d1, and the first transfer element GL2-1 extends in a second direction d2 perpendicular to the first direction d1 and is electrically connected to two of the plurality of first sub-pixel structures SPX1. The two first sub-pixel structures SPX1 are arranged in a third direction d3', the third direction d3' is staggered with the first direction d1 and the second direction d2, and the two first sub-pixel structures SPX1 are two of the plurality of first-type sub-pixel structures SPX1-1.

In brief, in the embodiment of FIG. 6, the plurality of first sub-pixel structures SPX1 that are susceptible to the gate driving signal of the transfer element GL2 and electrically connected to the transfer element GL2 are disposed in a diagonal direction (that is, the third direction d3') and are all disposed in at least one secondary area (the area occupied by the dot pattern in FIG. 6) with low brightness.

Different from the embodiment of FIG. 2, in the embodiment of FIG. 2, the plurality of first sub-pixel structures SPX1 that are susceptible to the gate driving signal of a first transfer element GL2-1 and electrically connected to the first transfer element GL2-1 are respectively disposed at the upper right and lower left. However, in the embodiment of FIG. 6, the plurality of first sub-pixel structures SPX1 that are susceptible to the gate driving signal of the first transfer element GL2-1 and electrically connected to the first transfer element GL2-1 are respectively disposed at the upper left and lower right.

Figure 7:
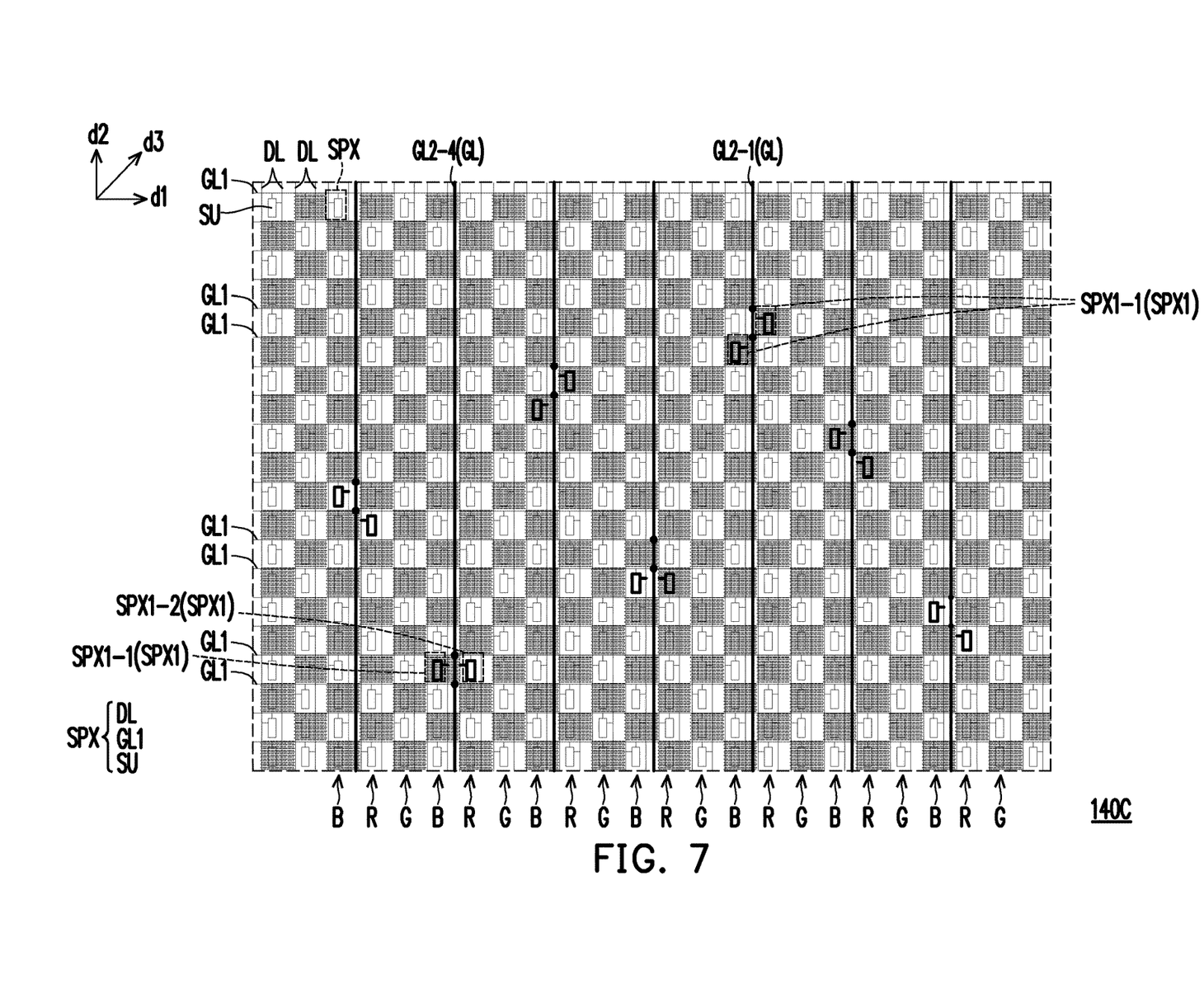
FIG. 7 is a schematic top view of a pixel array 140C according to an embodiment of the disclosure.

FIG. 7 is a schematic top view of a pixel array 140C according to an embodiment of the disclosure. The pixel array 140C of FIG. 7 may replace the pixel array 140 of the display panel 10 of FIG. 1, to form the display panel (not shown) of the present embodiment.

Referring to FIG. 2 and FIG. 7, the display panel in the present embodiment is similar to the foregoing display panel 10. A main difference between the two is that: when the spatial domain function is turned on and a grayscale image is displayed, distribution manners of main areas (the area not occupied by the dot pattern in FIG. 2 and FIG. 7) and a plurality of secondary areas (the areas occupied by the dotted pattern in FIG. 2 and FIG. 7) of the two are different.

Different from the embodiment of FIG. 2, in the embodiment of FIG. 7, each main area (the area not occupied by the dot pattern in FIG. 7) is an area in which a sub-pixel structure SPX is located, each of the secondary areas (the area not occupied by the dot pattern in FIG. 7) is also an area in which a sub-pixel structure SPX is located, and a plurality of main areas (the areas not occupied by the dot pattern in FIG. 7) and a plurality of secondary areas (the areas occupied by the dot pattern in FIG. 7) are alternately arranged in the first direction d1 and the second direction d2. In short, different from the embodiment of FIG. 2, in the embodiment of FIG. 7, the plurality of main areas and the plurality of secondary areas are in a checkerboard shape with high density.

Figure 8:
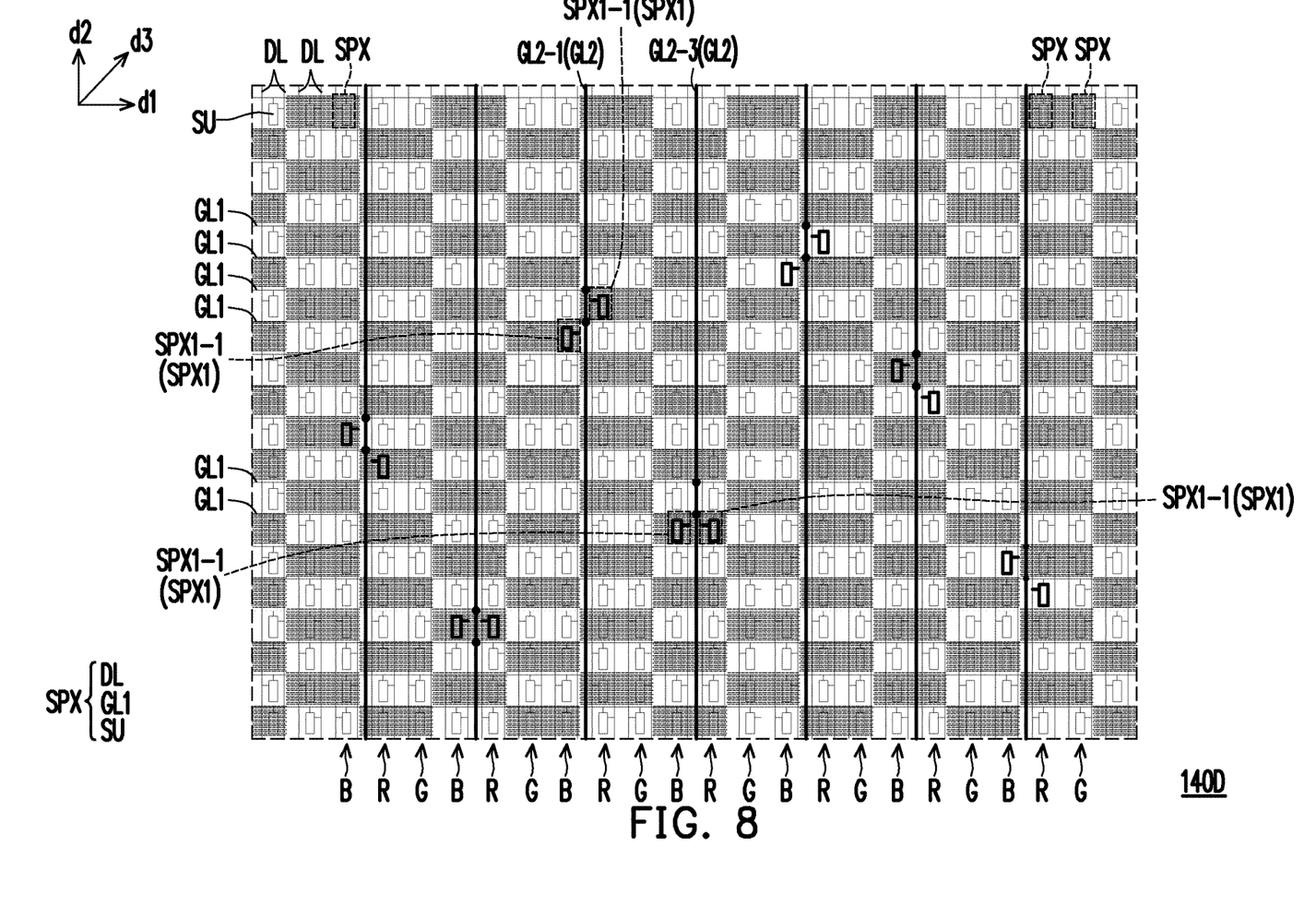
FIG. 8 is a schematic top view of a pixel array 140D according to an embodiment of the disclosure.

FIG. 8 is a schematic top view of a pixel array 140D according to an embodiment of the disclosure. The pixel array 140D of FIG. 8 may replace the pixel array 140 of the display panel 10 of FIG. 1, to form the display panel (not shown) of the present embodiment.

Referring to FIG. 2 and FIG. 8, the display panel in the present embodiment is similar to the foregoing display panel 10. A main difference between the two is that: when the spatial domain function is turned on and a grayscale image is displayed, distribution manners of main areas (the area not occupied by the dot pattern in FIG. 2 and FIG. 8) and a plurality of secondary areas (the areas occupied by the dotted pattern in FIG. 2 and FIG. 8) of the two are different.

Different from the embodiment of FIG. 2, in the embodiment of FIG. 8, each main area (the area not occupied by the dot pattern in FIG. 8) is an area in which two sub-pixel structures SPX are located, each of the secondary areas (the area not occupied by the dot pattern in FIG. 8) is also an area in which two sub-pixel structures SPX are located, and a plurality of main areas (the areas not occupied by the dot pattern in FIG. 8) and a plurality of secondary areas (the areas occupied by the dot pattern in FIG. 8) are alternately arranged in the first direction d1 and the second direction d2. In short, different from the embodiment of FIG. 2, in the embodiment of FIG. 8, the plurality of main areas and the plurality of secondary areas are in a checkerboard shape with slightly high density.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
a plurality of sub-pixel structures, wherein each of the sub-pixel structures comprises a data line, a scan line, an active element, and a pixel electrode, the data line and the scan line are electrically connected to the active element, the active element is electrically connected to the pixel electrode, and the sub-pixel structures are arranged in 24 columns and 20 rows; and
a plurality of transfer elements disposed between the sub-pixel structures, intersected with the scan lines of the sub-pixel structures, and electrically connected to the scan lines of the sub-pixel structures,
wherein the sub-pixel structures comprise a plurality of first sub-pixel structures, the data line of each of the first sub-pixel structures is disposed adjacent to a corresponding transfer element, and the scan line of the first sub-pixel structure is electrically connected to the transfer element,
wherein the first sub-pixel structures comprise a plurality of first-type sub-pixel structures and a plurality of second-type sub-pixel structures, when the display panel displays a grayscale picture, each of the first-type sub-pixel structures has a first brightness, each of the second-type sub-pixel structures has a second brightness, and the first brightness is less than the second brightness,
wherein a number of the first-type sub-pixel structures is more than a number of the second-type sub-pixel structures of the sub-pixel structures;
wherein the transfer elements comprise a first transfer element and are arranged in a first direction, the first transfer element extends in a second direction perpendicular to the first direction and is electrically connected to two of the first sub-pixel structures, the two first sub-pixel structures are arranged in a third direction, the third direction is staggered with the first direction and the second direction, and the two first sub-pixel structures are two of the first-type sub-pixel structures, and the scan lines of the two of the first-type sub-pixel structures are two adjacent scan lines spaced from each other.

2. The display panel according to claim 1, wherein the transfer elements comprise a second transfer element and are arranged in the first direction, the second transfer element extends in the second direction perpendicular to the first direction and is electrically connected to two of the first sub-pixel structures, the two first sub-pixel structures are arranged in the third direction, the third direction is staggered with the first direction and the second direction, one of the two first sub-pixel structures is one of the first-type sub-pixel structures, and the other one of the two first sub-pixel structures is one of the second-type sub-pixel structures.

3. The display panel according to claim 1, wherein the transfer elements comprise a third transfer element and are arranged in the first direction, the third transfer element extends in the second direction perpendicular to the first direction and is electrically connected to two of the first sub-pixel structures, the two first sub-pixel structures are arranged in the first direction, and the two first sub-pixel structures are two of the first-type sub-pixel structures.

4. The display panel according to claim 1, wherein the transfer elements comprise a fourth transfer element and are arranged in the first direction, the fourth transfer element extends in the second direction perpendicular to the first direction and is electrically connected to two of the first sub-pixel structures, the two first sub-pixel structures are arranged in the first direction, one of the two first sub-pixel structures is one of the first-type sub-pixel structures, and the other one of the two first sub-pixel structures is one of the second-type sub-pixel structures.

5. The display panel according to claim 1, wherein the grayscale picture is a $32^{nd}$ grayscale picture, a $64^{th}$ grayscale picture, a $96^{th}$ grayscale picture, a $128^{th}$ grayscale picture, a $160^{th}$ grayscale picture, a $192^{nd}$ grayscale picture, or a $224^{th}$ grayscale picture.

6. The display panel according to claim 1, wherein the transfer elements are arranged in the first direction, each of the transfer elements extends in the second direction perpendicular to the first direction, the sub-pixel structures comprise a plurality of first sub-pixel columns and a plurality of second sub-pixel columns, a plurality of sub-pixel structures of each of the first sub-pixel columns are arranged in the second direction and are configured to display blue, a plurality of sub-pixel structures of each of the second sub-pixel columns are arranged in the second direction and are configured to display red, and each of the transfer elements is disposed between a corresponding one of the first sub-pixel columns and a corresponding one of the second sub-pixel columns.

* * * * *